(12) United States Patent
Konter et al.

(10) Patent No.: US 6,277,500 B1
(45) Date of Patent: Aug. 21, 2001

(54) GAS TURBINE COMPONENT

(75) Inventors: Maxim Konter, Klingnau; Wilfried Kurz, La Conversion; Matthias Gaumann, Tolochenaz, all of (CH)

(73) Assignee: ABB Research Ltd., Zurich (CH)

( * ) Notice: Subject to any disclaimer, the term of this patent is extended or adjusted under 35 U.S.C. 154(b) by 0 days.

(21) Appl. No.: 09/433,079

(22) Filed: Nov. 3, 1999

(30) Foreign Application Priority Data

Nov. 10, 1998 (EP) .................................................. 98811125

(51) Int. Cl.⁷ .................................................... B32B 15/00
(52) U.S. Cl. ........................... 428/615; 428/652; 428/668; 428/670; 428/678; 428/680; 416/241 R
(58) Field of Search ..................... 428/610, 615, 428/668, 670, 678, 680; 420/447, 460; 148/427, 428; 416/241 R

(56) References Cited

U.S. PATENT DOCUMENTS

| 4,419,416 | * | 12/1983 | Gupta et al. .......................... 428/656 |
| 4,643,782 |   | 2/1987  | Harris et al. . |
| 4,677,035 | * | 6/1987  | Fiedler et al. ....................... 428/680 |
| 4,719,080 | * | 1/1988  | Duhl et al. ........................... 420/443 |
| 4,758,480 |   | 7/1988  | Hecht et al. . |
| 5,077,141 | * | 12/1991 | Naik et al. ........................... 428/680 |
| 5,232,789 |   | 8/1993  | Platz et al. . |
| 5,262,245 | * | 11/1993 | Ulion et al. .......................... 428/469 |
| 5,312,584 |   | 5/1994  | Frasier et al. . |
| 5,759,301 | * | 6/1998  | Konter et al. ........................ 148/404 |
| 5,759,303 | * | 6/1998  | Milhalisin et al. ................... 148/428 |
| 5,888,451 | * | 3/1999  | Konter et al. ........................ 420/448 |
| 5,891,267 | * | 4/1999  | Schaeffer et al. .................... 148/206 |
| 6,024,792 | * | 2/2000  | Kurz et al. ............................... 117/9 |

FOREIGN PATENT DOCUMENTS

| 0740977A1 | 11/1996 | (EP) . |
| 0625585B1 | 5/1997  | (EP) . |
| 0821076A1 | 1/1998  | (EP) . |
| 0861927A1 | 9/1998  | (EP) . |
| 0892090A1 | 1/1999  | (EP) . |

OTHER PUBLICATIONS

"Development of Two Rhenium–Containing Superalloys for Single–Crystal Blade and Directionally Solidified Vane Applications in Advanced Turbine Engines", Harris, et al., Journal of Materials Engineering and Performance, vol. 2(4) Aug. 1993, pp.181–187.

* cited by examiner

*Primary Examiner*—Deborah Jones
*Assistant Examiner*—Bryant Young
(74) *Attorney, Agent, or Firm*—Burns, Doane, Swecker & Mathis, L.L.P.

(57) ABSTRACT

A gas turbine component consists of a superalloy base material with a single crystal structure and a protective coating layer. The coating layer has a single crystal structure, which is epitaxial with the base material.

6 Claims, 3 Drawing Sheets

GAS TURBINE COMPONENT

TECHNICAL FIELD

The invention relates to a gas turbine component in accordance with the preamble of the first claim.

It likewise relates to a method for protecting a gas turbine component in accordance with the preamble of the independent method claim.

BACKGROUND OF THE INVENTION

Latest turbine experience clearly shows that mechanical properties of coatings are one of the most critical material issues in advanced turbines. Progress in blading materials and technologies (i.e. single crystal blading) is not followed by today coating systems. Thermo-Mechanical-Fatigue (TMF) properties of coated alloys are far below those for uncoated single crystal (SX) material. The main effort in increasing of the TMF life of the coated component concentrates now in two directions. The first is to fit the coating composition to the composition of the substrate. That minimizes the difference in thermal expansion between coating and substrate. The second is in providing a fine grain structure to the coating in order to increase ductility and therefore reduce stress accumulation due to the difference in mechanical behavior of the coating and the substrate.

U.S. Pat. No. 4,758,480 discloses a class of coatings whose composition is based on the composition of the underlying substrate. The similarity in phase structure and in the chemical composition renders the mechanical properties of the coating similar to those of the substrate thereby reducing thermomechanically-reduced damage during service. However, when this coating is applied by traditional means on the single crystal substrate, the difference in the E-modulus between <010> oriented surface layer of the substrate and randomly oriented coating grains produce high TMF damage.

U.S. Pat. No. 5,232,789 discloses the further improvement of the TMF properties of the coating-substrate system. The coating, which has composition and phase structure similar to the substrate alloy, has at least 1000 times more fine-grained structure, produced by a special technology. The lowermost interface portion of the fine-grained coating grows epitaxially, and therefore has the same crystal orientation as the substrate. Epitaxial growth solves also coating/substrate interface adhesion problem.

However, the system of a single crystal substrate and the multicrystal coating still has a large difference in the mechanical behavior between the substrate and the coating as any equiaxed structure possesses E-modulus much higher than those for single crystal material in <001> direction. Higher E-modulus reflects in lower TMF life of the coating compared to the substrate (although the stresses on substrate-coating interface are significantly reduced compared to the traditional coating-substrate system). Multiple grain boundaries drastically reduce the creep resistance of the fine-grain coating, which finally determines life of the entire blading system.

SUMMARY OF THE INVENTION

Accordingly, one object of the invention is to provide coatings which mechanical properties which are adjusted to the substrate and which have a high TMF life.

According to the invention, this is achieved by the features of the first claim.

The core of the invention is therefore the fully single crystal structure of the coated gas turbine component, which with single crystall coating layer is grown epitaxially to the base material.

The advantages of the invention can be seen, inter alia, in the fact that a fully single crystal structure of the coated component, including a MCrAlY-type coating, grown epitaxially to the base material will minimise the difference in E-modulus and therefore in TMF life between single crystal substrate and the coating. The base material and the coating have the same crystallographic orientation and therefore E-modulus is almost constant over the substrate/coating system. Through optimization of the chemical composition of the coating it is possible to achieve very low mismatch in thermal expansion between coating and substrate. Creep properties of the epitaxial coating are made equal to those of the substrate by chemistry optimization, which is impossible for the system single crystal substrate-fine-grained coating. The entire system therefore will have mechanical properties close to those for the base material and the life-time is at least doubled compared to the traditional single crystal substrate-fine-grained coating systems.

Further advantageous embodiments of the invention emerge from the subclaims. Moreover, a method for protecting a gas turbine component is further specified.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying pictures, wherein.

DESCRIPTION OF THE PREFERRED EMBODIMENTS

A laser cladding technology has been used to apply an epitaxial coating with 100–300 μm thickness on the single crystal superalloy substrate. Because the coating is epitaxially grown on the substrate, it has the same crystal orientation as the substrate.

Figure 1:
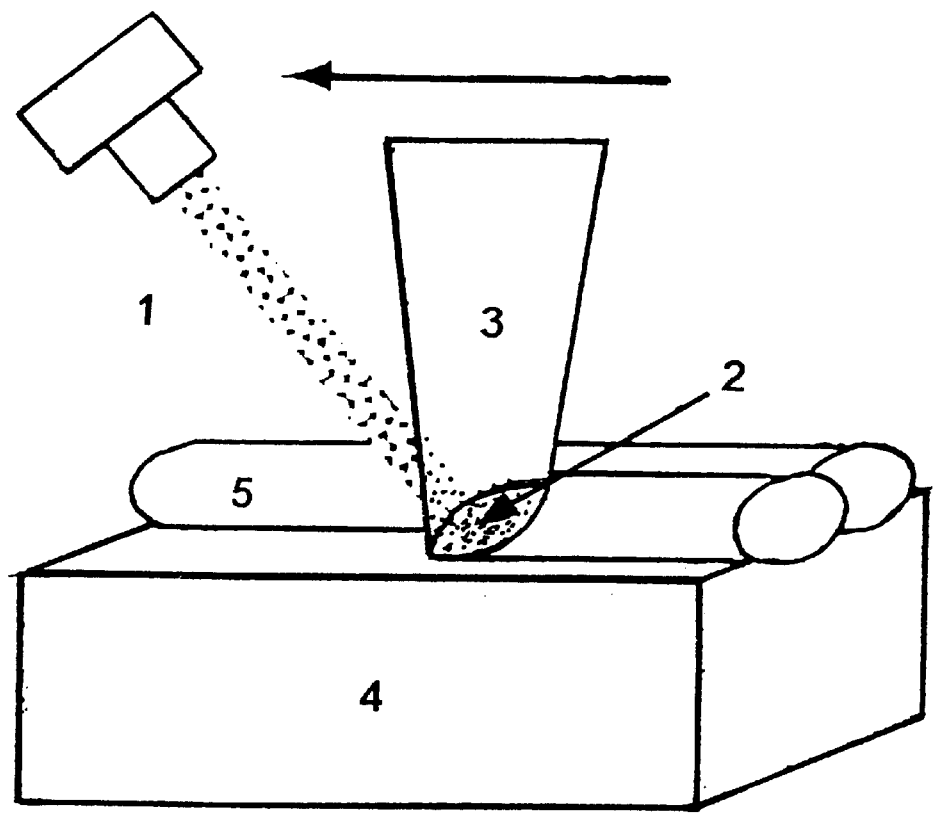
FIG. 1 Schematic representation of a laser cladding process.

In FIG. 1 a laser cladding process is shown which is characterized by impinging a metallic powder jet 1 onto a molten pool 2 formed by controlled laser heating by scanning the laser beam 3 successively over the substrate 4 (see the arrow showing the movement over the substrate), a two dimensional clad 5 can be deposited. This kind of technolgy is illustrated in FIG. 1.

In the example of FIG. 1 a $CO_2$ Laser has been used during the experiment. The supply material has been fed under protective gas like Argon.

U.S. Pat. No. 4,643,782 discloses a nickel base alloy with the trademark name "CMSX-4", essentially comprising (measured in % by weight): 9.3–10.0 Co, 6.4–6.8 Cr, 0.5–0.7 Mo, 6.2–6.6 W, 6.3–6.7 Ta, 5.45–5.75 Al, 0.8–1.2 Ti, 0.07–0.12 Hf, 2.8–3.2 Re, remainder being Ni with impurities.

A single crystal bar with <001> crystallographic orientation cast in alloy CMSX-4 was coated with MCrAlY-type coating, especially an NiCrAlY-type coating called SV20 by laser cladding with a 1,7 kW cw CO2 laser in argon protective atmosphere, like it is shown in FIG. 1.

The SV-20 coating essentially comprising (measured in % by weight): 25% Cr; 5,5% Al; 2,7% Si; 1% Ta; 0,5% Y, remainder being Ni.

Typical process parameters for growing the coating onto the sustrate via laser cladding technology are as follow:

| | |
|---|---|
| Laser Power | 800 W |
| Laserbeam Diameter | 2.8 mm |
| Laserscanning Speed | 250 mm/min |
| Powder Feed Rate | 2 g/min |
| Gas Protection | Ar 35 l/min |
| Preheating | None |
| Intertrack Step | 0.9 mm |
| Treatment Length | 4 × 37,5 mm |
| Powder Size | 35–90 μm |
| Powder Efficiency | 56% |
| Final Temperature | 300° C. |
| Processing Time | 52'22" |

A single crystalline coating was produced by epitaxial growth of the SV20 on the CMSX-4 substrate. In following the single crystalline SV20 coating produced by laser cladding will be called SV20 SX. The coated test bar was cut in longitudinal and transverse sections. Some of these sections were heat treated in inert gas at 1140° C. for 4 hours. This kind of heat treatment has as a purpose a diffusion treatment of the interface between coating and substrate, as well as homogensiation of coating and γ'-phase precipitation heat treatment of the CMSX-4 substrate.

The transverse and longitudinal specimens in as deposited and heat treated condition were mounted, ground and polished up to 1 μm diamond paste for the metallographic investigation. For the fine microstructure and analytical investigation the samples were chemical etched according to the standard procedure for Ni-base superalloys. For the investigation of secondary grains the samples were newly polished and etched with the following etchant:

| | |
|---|---|
| 100 ml | $H_2O$ |
| 100 ml | HCl |
| 5 g | Cu(ll)chloride (room temperature, time ≈ 10 s) |

The etchants basically both attack Al-rich phases. The Cu(ll)chloride etchant indicates different grains better. The microstructure was assessed with optical microscope, SEM, EDX analysis, digital image analysis and EBSD technique.

Figure 2:
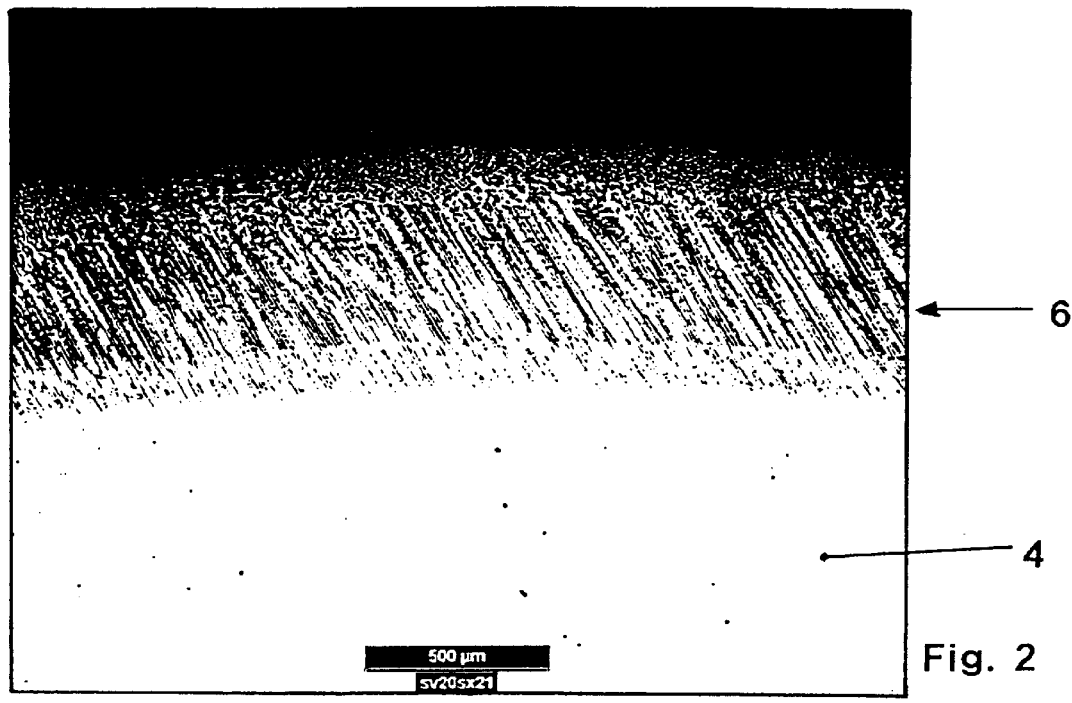
FIG. 2 Optical micrograph of base material coated with single crystal structure.
Figure 3:
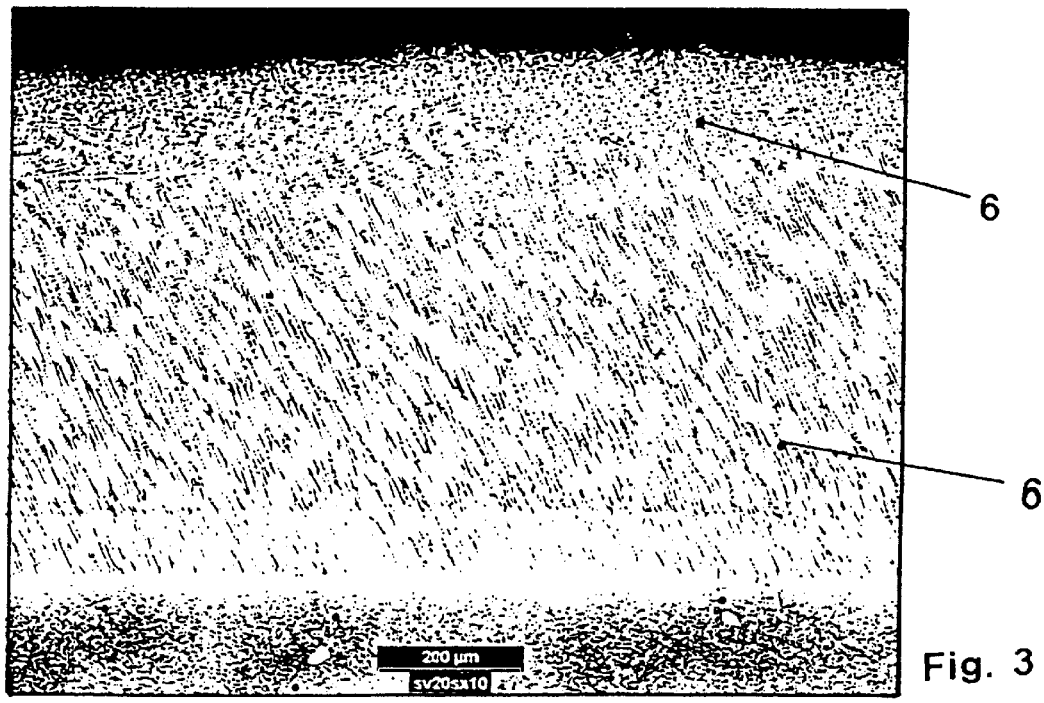
FIG. 3 Optical micrograph of base material coated with single crystal structure, higher resolution.
Figure 4:
FIG. 4 SEM micrograph of coating.

Microstructural analysis showes that dendrites 6 are created of the epitaxially grown coating on the base material 4 so that a single crystal structure is achieved (see FIGS. 2, 3). Depending on the location of the sample periphery in the transverse cross section the main growth direction changes from the primary dendrite tranks to the secondary arms without change in the underlaying crystal orientation. The micrograph shows a perfect epitaxial growth on the base material. Only the outer region of the coating has a different lattice direction as indicated by differently oriented dendrites. This polycristalline region can be avoided by fitting the cladding parameters or by machining. The latter does not disturb the single crystalline product. The measured thickness of the various regions in the coating are as follows:

CMSX-4 remelting region: 60 to 100 μm
single crystal region: 400 to 550 μm
polycrystalline region 100 to 250 μm Taking into account that the typical thickness of the coating on gas turbine blades and vanes is about 150–300 μm, it is clear, that a fully SX coating can be provided even if the polycrystalline regions of the coating have to be machined away.

Figure 5:
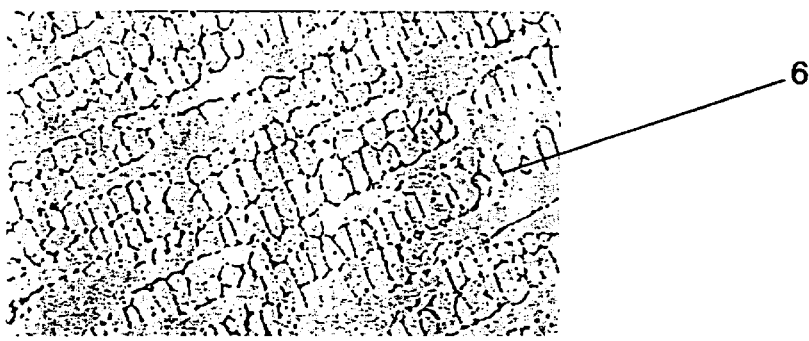
FIG. 5 SEM micrograph of coating, higher resolution.
Figure 6:
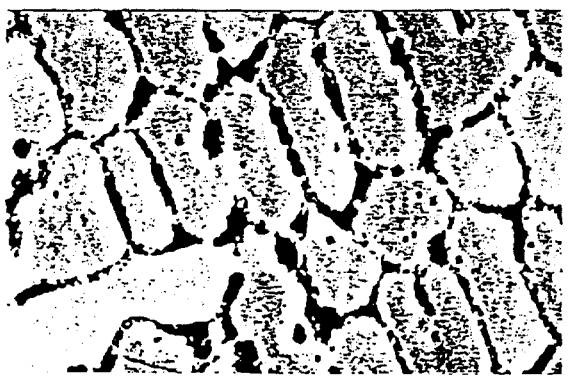
FIG. 6 SEM micrograph of coating, highest resolution.

The SEM micrographs of FIGS. 4 to 7 show the microstructure of SV20 SX in as deposited condition with increasing scaling factor form FIG. 4 to FIG. 7. The coating consists of 96 vol. % dendrites. The dendrites are single phase as far as the applied investigation method shows. The interdendritic space consists of at least two phases, which are the matrix (dark in the SEM images, FIGS. 4 to 7) and bright precipitates that surround chain like the dendrites (FIG. 5).

Figure 7:
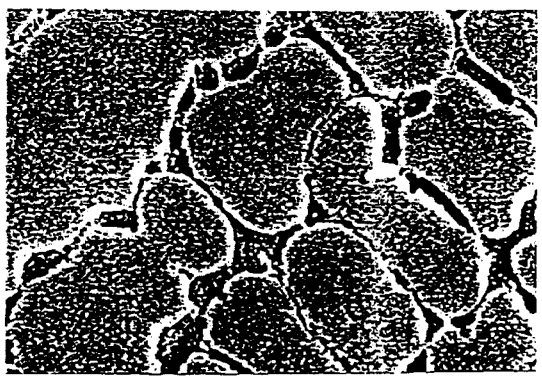
FIG. 7 SEM micrograph of coating, different etchant.

The interdendritic matrix possibly contains also very small other precipitates (FIG. 6) but this is not clearly visible in the SEM image. Furthermore the coating includes small shrinkage cavities (<10 μm) with the periphery/walls enriched with yttrium (appendix A4). In all other phases Y was not detected. The remelting zone of the CMSX-4 contains bright Ta, Si rich particles, which are located in the interdendritic space and has a perfect epitaxial structure (FIG. 7). Phase composition of the SX coating is very similar to those of the standard vacuum plasma sprayed polycrystalline coating in as-sprayed condition.

Instead of a similar material as the base material, the coating material can also consist of a Al containing intermetallic material. This can be PtAl or complex alloys like Fe—Cr—Al-alloy known from EP 0 625 585 B1, which are highly oxidation resistant.

The high level of Al (and/or Si) in the intermetallic material or in the alloy containing intermetallic phase is necessary in order to provide the dence, stable layer of $Al_2O_3$ oxide on the coating surface which effectively presents oxidation of the coating and the substrate.

The invention is of course not restricted to the exemplary embodiment shown and described.

Obviously, numerous modifications and variations of the present invention are possible in light of the above teachings. It is therefore to be understood that within the scope of the appended claims, the invention may be practiced otherwise than as specifically described herein.

What is claimed is:

1. A gas turbine component comprising a superalloy base material with a single crystal structure and a protective coating layer, wherein the coating layer has a thickness of about 100–300 μm and a single crystal structure which is epitaxial with the base material.

2. A gas turbine component comprising a superalloy base material with a single crystal structure and a protective coating layer, wherein the coating layer has a single crystal structure which is epitaxial with the base material and the coating comprises an MCrAlY-alloy.

3. The gas turbine component as claimed in claim 2, wherein the coating comprising in % by weight: 25% Cr; 5.5% Al; 2.71% Si; 1% Ta; 0.5% Y; the remainder Ni.

4. A gas turbine component comprising a superalloy base material with a single crystal structure and a protective coating layer, wherein the coating layer has a single crystal structure which is epitaxial with the base material and the coating comprises an intermetallic material containing Al.

5. A gas turbine component comprising a superalloy base material with a single crystal structure and a protective coating layer, wherein the coating layer has a single crystal structure which is epitaxial with the base material and the coating comprises PtAl.

6. The gas turbine component as claimed in claim 1, wherein the base superalloy material comprises in % by weight: 9.3–10.0 Co, 6.4–6.8 Cr, 0.5–0.7 Mo, 6.2–6.6 W, 6.3–6.7 Ta, 5.45–5.75 Al, 0.8–1.2 Ti, 0.07–0.12 Hf, 2.8–3.2 Re, remainder being Ni with impurities.

* * * * *